United States Patent [19]

Satomi

[11] Patent Number: 5,005,079
[45] Date of Patent: Apr. 2, 1991

[54] AUTOMATIC FREQUENCY CONTROL CIRCUIT

[75] Inventor: Hideo Satomi, Nitta, Japan

[73] Assignee: Sanyo Electric Co., Ltd., Japan

[21] Appl. No.: 492,759

[22] Filed: Mar. 13, 1990

[30] Foreign Application Priority Data

Mar. 16, 1989 [JP] Japan .................................. 1-65528

[51] Int. Cl.$^5$ ............................................. H04N 5/04
[52] U.S. Cl. ................................... 358/158; 358/148
[58] Field of Search ................... 358/148, 158, 17, 19; 331/20

[56] References Cited

U.S. PATENT DOCUMENTS 4,092,672 5/1978 Aschwanden ....................... 358/149
4,290,029 9/1981 Streckenbach ......................... 331/1
4,812,783 3/1989 Honjo et al. ....................... 358/158
4,843,469 6/1989 Boyce ................................. 358/148

FOREIGN PATENT DOCUMENTS 0012899 7/1980 European Pat. Off. .
0258042 3/1988 European Pat. Off. .
2932049 12/1981 Fed. Rep. of Germany .
60-66590 4/1985 Japan .

Primary Examiner—Howard W. Britton
Assistant Examiner—David E. Harvey
Attorney, Agent, or Firm—Peter L. Michaelson

[57] ABSTRACT

An AFC circuit for use in a chrominance signal processing circuit of a VTR basically includes a VCO (9), a frequency divider (9, 10, 11, 12, 13) for frequency-dividing an output of the VCO, and a phase comparing circuit (17) for comparing phases of the output of the divider and a horizontal synchronizing signal extracted from an inputted video signal to supply an error output to the VCO. When a phase relation between the output of the divider and the horizontal synchronizing signal becomes a miss-locked state out of the phase-locked state, a frequency-dividing operation is stopped at a timing corresponding to a rise of a normal inputted signal in a phase-locked state and the frequency-dividing operation is restarted after the inputted horizontal synchronizing signal is counted by a predetermined number. As a result, the phase-locked state of the inputted horizontal synchronizing signal and the output signal of the divider is forcibly restored.

2 Claims, 6 Drawing Sheets

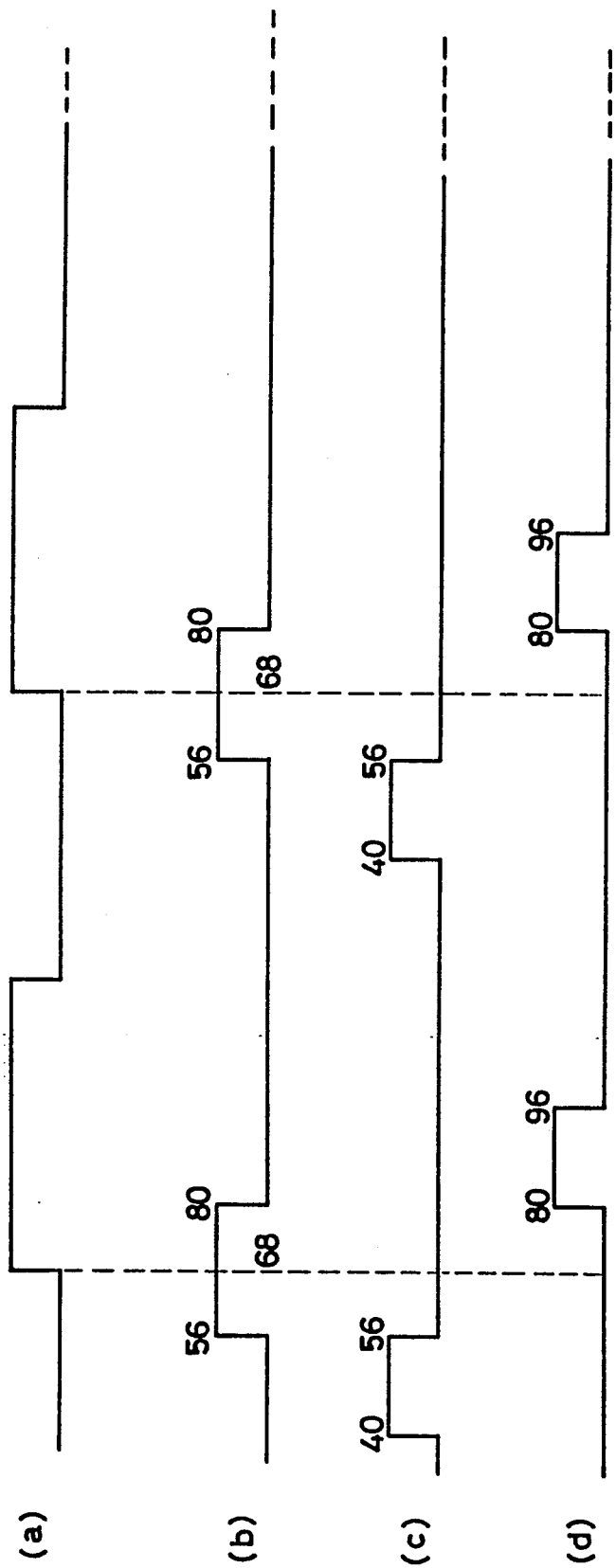

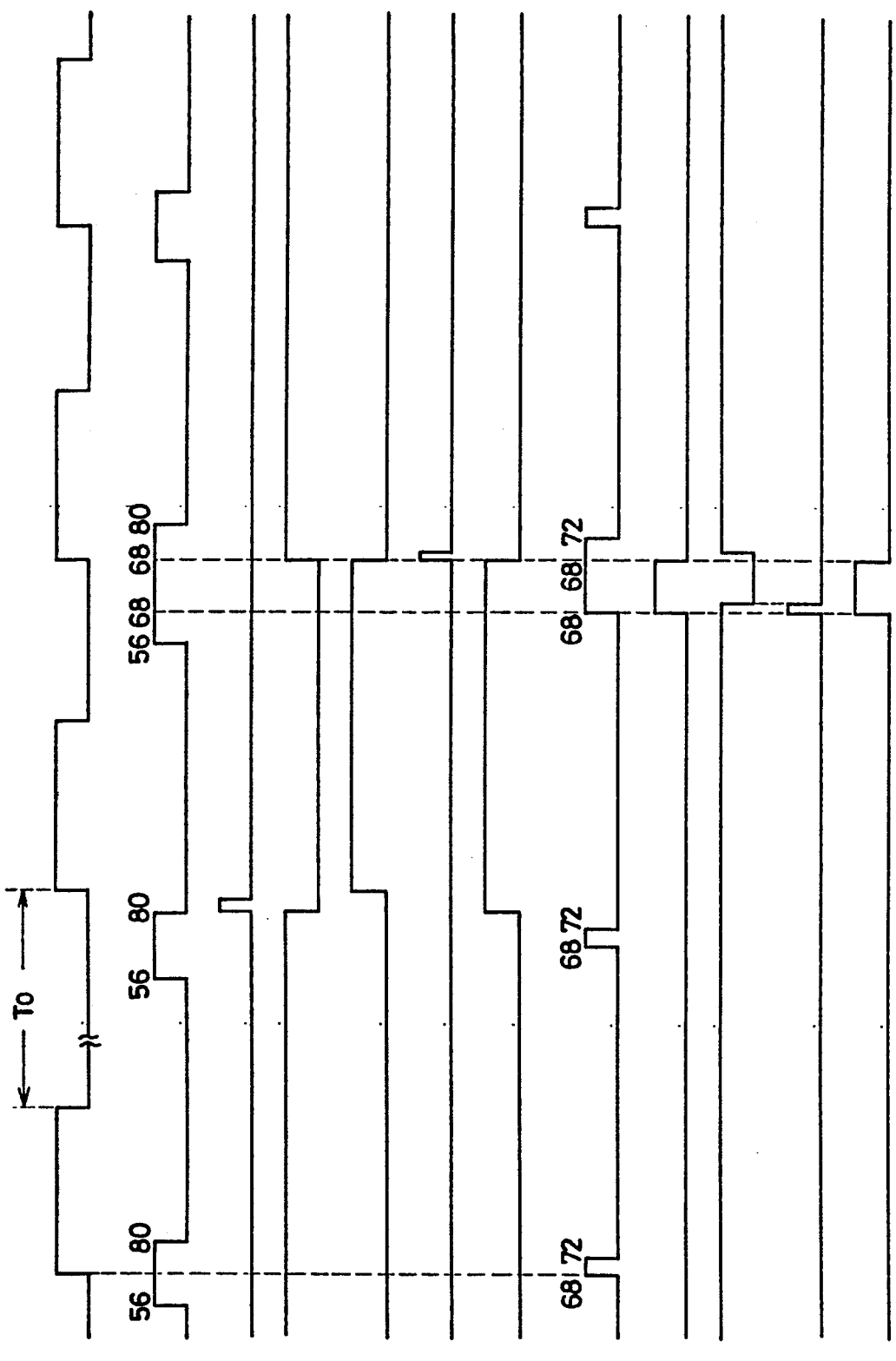

AUTOMATIC FREQUENCY CONTROL CIRCUIT

BACKGROUND OF THE INVENTION

1. Field of the Invention

The present invention relates generally to automatic frequency control circuit (referred to as AFC circuit hereinafter) having a reduced synchronization capturing period, and more particularly, to an AFC circuit suitable for use in, for example, a chrominance signal processing circuit in a recording system of a video tape recorder (referred to as VTR hereinafter).

2. Description of the Background Art

Conventionally, a chrominance signal processing circuit for a VTR is constituted such that a carrier chrominance signal having a frequency of 3.58 MHz is converted into a low-frequency converted chrominance signal having a frequency $f_a$ of 629 kHz and recorded on a magnetic tape at the time of recording, and at the time of reproducing, the low-frequency converted chrominance signal reproduced from the magnetic tape is converted into a reproduced carrier chrominance signal having a frequency $f_c$ of 3.58 MHz. Such a method of recording chrominance signals can prevent a frequency bandwidth required for recording from being enlarged.

A frequency conversion of a carrier chrominance signal into a low-frequency converted chrominance signal at a time of recording is generally performed based on an output signal obtained from a voltage controlled oscillation circuit (referred to as VCO hereinafter) as a result of controlling an oscillating frequency of the VCO based on a horizontal synchronizing signal obtained separated from an input video signal, that is, as a result of an automatic frequency controlling. Namely, the above described frequency conversion of a chrominance signal is performed based on an oscillating frequency signal of a VCO circuit in an AFC circuit, captured into a frequency of a horizontal synchronizing signal and phase-locked therewith.

Meanwhile, such problems as follows occur in converting a frequency of a chrominance signal in response to a signal locked into a frequency of an inputted horizontal synchronizing signal by using a VCO circuit. More specifically, if the extent that an oscillating frequency of the VCO circuit changes is large, when the oscillating frequency of the VCO circuit and the frequency of the horizontal synchronizing signal are largely different, such as in activating an AFC circuit, it takes a long time to capture the oscillating frequency of the VCO circuit into the frequency of the horizontal synchronizing signal. On the other hand, it is difficult to reduce the extent that the oscillating frequency of the VCO circuit changes because of dispersion of parameters of the VCO circuit.

Therefore, in order to resolve such problems, a frequency converting circuit is proposed, in which loop gain of an AFC loop including a VCO circuit is increased during the fluctuation of a horizontal synchronizing signal and which is disclosed in, for example, Japanese Patent Laying Open No. 60-66590.

FIG. 1 is a schematic block diagram showing a conventional chrominance signal processing circuit including such a frequency converting circuit in a recording system of a VTR. Referring to FIG. 1, a carrier chrominance signal in a video signal to be recorded is applied to an input terminal 101 and is supplied to a bandpass filter 103 (referred to as BPF hereinafter) of 3.58 MHz. The carrier chrominance signal passed through the BPF 103 is supplied to an ACC amplifier 104 wherein an ACC level of the signal is fixed by an automatic chrominance control by means of an ACC loop comprising the ACC amplifier 104, a burst amplifier 105 and an ACC detector 106. An output of the ACC amplifier 104, after a burst level thereof is emphasized by 6dB by means of a burst amplifier circuit 107, is supplied to a main converter 108. The main converter 108 is a frequency converter for converting a carrier chrominance signal of 3.58 MHz into a low-frequency converted chrominance signal of 629 kHz, based on a carrier signal of 4.21 MHz supplied from a BPF 109. Such carrier signal of 4.21 MHz is supplied from a sub-converter 110 through the BPF 109. The sub-converter 110 generates such carrier signal of 4.21 MHz by multiplying a signal of 3.58 MHz which phase is locked into a sub-carrier signal of 3.58 MHz of an inputted chrominance signal of and a signal of $40f_H$ ($f_H$ is a horizontal synchronizing signal frequency) which phase is locked into a horizontal synchronizing signal of an inputted video signal.

The signal of 3.58 MHz is generated by an APC loop comprising a VCO circuit 111 and a phase comparator circuit 112. More specifically, the VCO 111 has an oscillating frequency controlled by the phase comparator circuit 112 such that an oscillating signal thereof is phase-locked into a burst signal supplied from the burst amplifier 105.

On the other hand, a signal of $40f_H$ supplied to the sub-converter 110 is obtained by converting a signal having a frequency of $320 f_H$ supplied from an AFC circuit 113 into a signal having a frequency of $40 f_H$ by means of a phase shift circuit 114. The AFC circuit 113 generates a signal of $320 f_H$ which is phase-locked to a horizontal synchronizing signal $H_{SYNC}$ extracted from the inputted video signal and supplied through a terminal 119, as will be described later.

A killer circuit 116 is provided for eliminating chrominance signal components when a killer detection circuit 115 detects that a level of a chrominance signal in the inputted signal is decreased below a predetermined level due to various causes.

The chrominance signal which is low-frequency converted by the main converter 108 is outputted as a low-frequency converted chrominance signal of 629 kHz through a LPF 117 and a terminal 118 and then recorded on a magnetic tape by a magnetic head (not shown).

FIG. 2 is a block diagram showing in detail the AFC circuit 113 shown in FIG. 1, which is disclosed in, for example, the above described Japanese Patent Laying Open No. 60-66590. Referring to FIG. 2, an output signal of a VCO 1 oscillated at a frequency of a predetermined multiple of the horizontal synchronizing signal frequency $f_H$ is externally supplied from an output terminal 4 and also frequency-divided by a frequency-divider 2 and thereafter supplied to a phase comparing circuit 3. The horizontal synchronizing signal $H_{SYNC}$ supplied through the terminal 119 is also supplied to the phase comparing circuit 3. The phase comparing circuit 3 compares phases of both the signals to detect phase error therebetween and supplies the corresponding error output to an AFC current source 6 through an adder 8. A control current corresponding to the error output is supplied from the AFC current source 6, smoothed by a smoothing circuit 5 and then applied to a control input of the VCO 1. As a result, the VCO 1 oscillates stably in phase-synchronization with the horizontal synchronizing signal.

Now, it is assumed that the horizontal synchronizing signal period temporarily fluctuates greatly from this state. Then, as described above, a control signal for stabilizing the AFC loop is supplied from the phase comparing circuit 3 through the adder 8 to the AFC current source 6. At the same time, an AFCID circuit 7, on receiving an output of the frequency divider 2 and the horizontal synchronizing signal from the terminal 119, detects that the fluctuation of the horizontal synchronizing signal is significantly large and in response thereto, supplies an additional control signal to the adder circuit 8. The control signal is added to the above described control signal from the phase comparing circuit 3 in the adder 8, which is further supplied to the AFC current source 6. Thus, when the fluctuation of the horizontal synchronizing signal period is significantly large, a value of a control current supplied to the VCO 1 becomes large, so that the VCO 1 performs a frequency control more quickly. As the foregoing, in a conventional AFC circuit, in case fluctuation of a horizontal synchronizing signal period is significantly large, reduction of a capturing period of a AFC loop is achieved by temporarily increasing loop gain of the AFC loop.

Meanwhile, in case signals recorded on a video tape by a certain VTR are reproduced by another VTR, a phase of a horizontal synchronizing signal is shifted in a first period or a first horizontal synchronizing signal is dropped out at a timing of switching from the reproduction by a rotary head of A channel to the reproduction by a rotary head of B channel, that is, at a turning point of each field. More specifically, a tape width is changed due to tension of the tape caused when a rotary head is pressed onto the tape during the recording and reproducing and each VTR differs in tension of a tape, which results in fluctuation or dropout of a horizontal synchronizing signal at a turning point of each field, then reproduced by different VTRs. If this video signal including such a defective horizontal synchronizing signal in each field is recorded by still another VTR, in a AFC circuit in a chrominance signal processing circuit contained in the VTR, the AFC loop is disturbed every vertical period due to the above described detective horizontal synchronizing signal, causing the hue of the signal to be deteriorated. Since in such a case, defects such as fluctuation and dropout of the horizontal synchronizing signal occur only in the first horizontal period of each field, the above described deterioration of the hue can be prevented by correcting the defects in this first one period. If the above described AFC circuit shown in FIG. 2 is adopted in such a case, it detects a defective horizontal synchronizing signal in each field, thereby supplying a large AFC control current to the VCO and increasing the AFC loop gain, so that capturing operation is performed quickly. However, when such an excessive AFC current is supplied to the VCO, a large fluctuation of an oscillating frequency of the VCO continues after the first period in each field, thereby affecting the AFC loop even though it is in a normal state in which basically no correction is required, causing unnecessarily a phase to be unlocked and hue to be deteriorated.

Now, consider a case in which the received television broadcasting is directly recorded on a magnetic tape by using the AFC circuit of FIG. 2. In this case, if a horizontal synchronizing signal (including equalizing pulses) in a vertical synchronizing signal period fluctuates in a weak electric field while the AFC control current and the loop gain of the AFC loop are increased as described above, the noise in such a vertical synchronizing signal period is further increased by the increased loop gain, so that an AFC operation of the AFC loop is significantly disturbed since the noise during the vertical synchronizing signal period has higher level than that of the noise during a normal horizontal synchronizing signal period. That is, in such a case, the increase of the loop gain of the AFC loop causes the AFC loop to be disturbed and makes a capturing time period of the AFC loop longer, resulting in the deterioration of the hue in an upper region of a TV picture frame when the signals recorded on the tape in the above described manner are reproduced.

SUMMARY OF THE INVENTION

Therefore, an object of the present invention is to reduce a synchronization capturing period of an AFC circuit.

Another object of the present invention is to provide an AFC circuit achieving reduction of a synchronization capturing period without the increase of loop gain of an AFC loop.

A further object of the present invention is to provide an AFC circuit in which even if a phase of an inputted horizontal synchronizing signal is temporarily fluctuated, a phase relation before the fluctuation can be restored irrespective of a loop gain.

Still another object of the present invention is to provide an AFC circuit suitable for a chrominance signal circuit of an VTR in which hue in an upper region of a picture frame can be prevented from deteriorating even if a horizontal synchronizing signal in an inputted video signal is temporarily fluctuates or drops out, or includes noise.

Briefly stated, the present invention is an automatic frequency control circuit comprising a voltage controlled oscillator which oscillating frequency changes in response to a control input, a frequency divider for frequency dividing an oscillating output signal of the voltage controlled oscillator, a phase comparing circuit for comparing phases of an externally supplied input reference signal and an output signal of the frequency divider and generating an error output such that both signals enter a phase-locked state wherein both the signals have a predetermined phase relation and supplying the same to the control input of the voltage controlled oscillator, a miss-lock detection circuit for detecting the phase relation between the input reference signal and the output signal of the frequency divider becoming miss-locked, a circuit for once interrupting a frequency dividing operation of the frequency divider at a predetermined timing in response to a detection signal from the miss-lock detection circuit and thereafter forcibly restoring the phase-locked state of the input reference signal and the output signal of the frequency divider by restarting the frequency dividing operation in response to a subsequent input reference signal, and an output terminal for taking out an output of the voltage controlled oscillator.

According to another aspect of the present invention, the automatic frequency control circuit further comprises a mask circuit responsive to the detection signal from the miss-lock detection circuit for immediately interrupting the supply of the error output of the phase comparing circuit to the voltage control oscillator, and restarting the supply in response to the subsequent input reference signal.

Therefore, a principal advantage of the present invention is that capturing time period of an AFC circuit can be reduced without increasing the loop gain of the AFC circuit.

Another advantage of the present invention is that deterioration of hue in a picture frame can be prevented even in dubbing by a different VTR and in recording on a tape a received video signal in a weak electric field.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4, 5 and 6 are timing charts for explaining an operation of the AFC circuit shown in FIG. 3.

DESCRIPTION OF THE PREFERRED EMBODIMENTS

Figure 1:
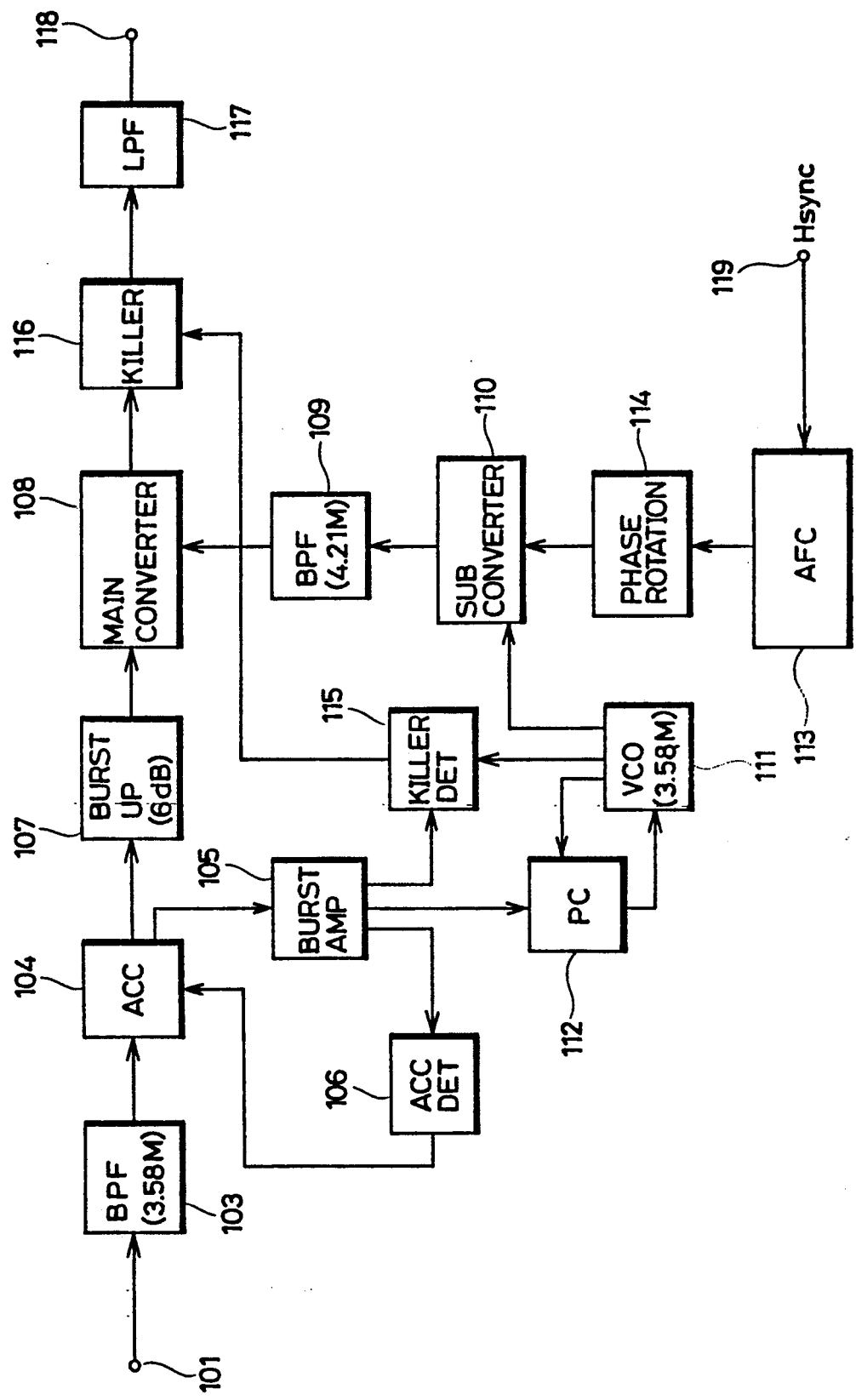
FIG. 1 is a schematic block diagram showing a conventional chrominance signal processing circuit in a recoding system of a VTR.
Figure 2:
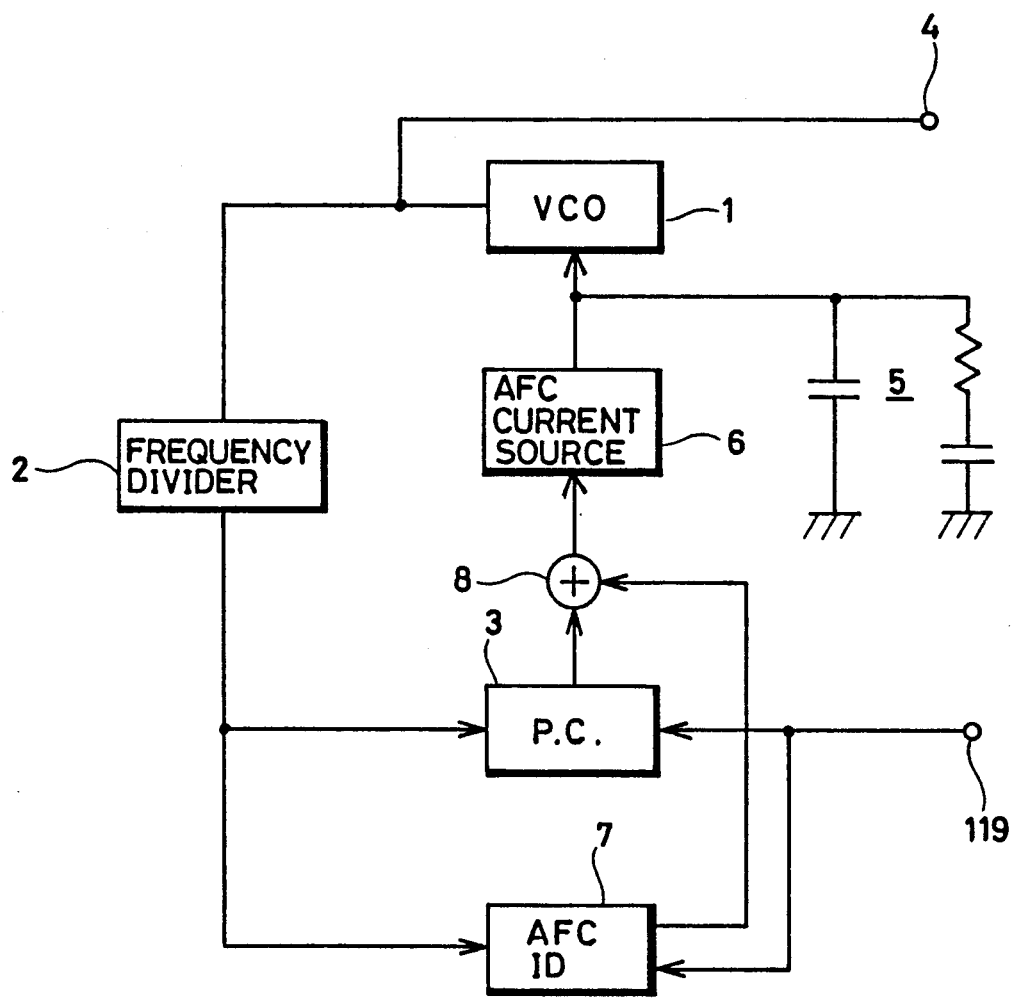
FIG. 2 is a block diagram showing in detail an AFC circuit shown in FIG. 1.
Figure 3:
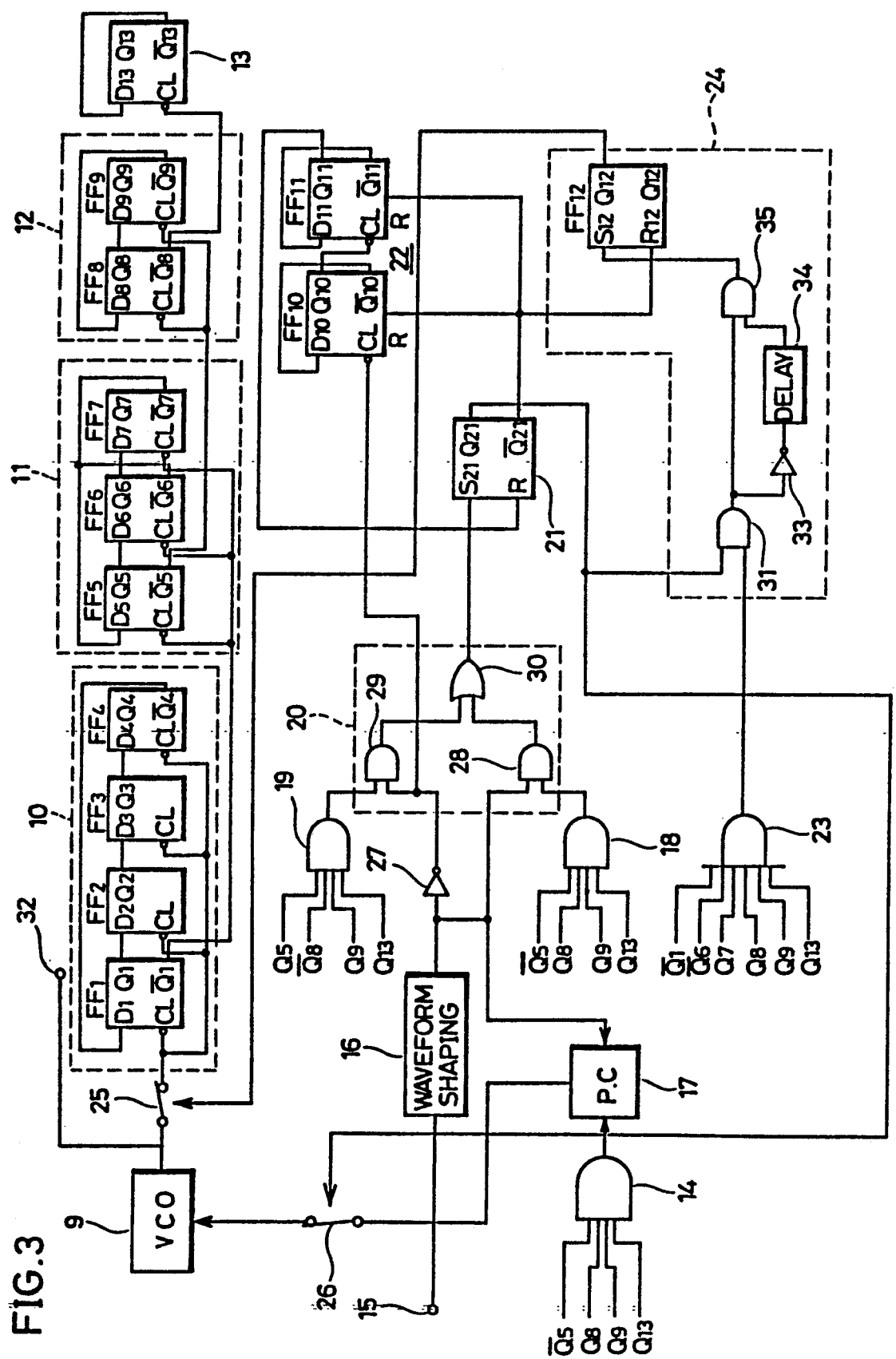
FIG. 3 is a block diagram showing an AFC circuit according to one embodiment of the present invention.

FIG. 3 is a block diagram showing an AFC circuit according to one embodiment of the present invention. Referring to FIG. 3, an oscillating output of a VCO 9 oscillating at a frequency of 320 $f_H$ is externally outputted through a terminal 32 and is also supplied through a switch 25 to a ¼ frequency divider 10 wherein frequency thereof is divided into ¼. The ¼ divider 1 comprises four D-type flip-flops D-FF1 to D-FF4 connected in series. An output of the ¼ divider 10 is supplied to a 1/5 frequency divider 11 comprising D-FF5, D-FF6 and D-FF7 connected in series, wherein a frequency thereof is divided into 1/5. An output of the 1/5 frequency divider 11 is supplied to a ¼ frequency divider 12 comprising D-FF8 and D-FF9 connected in series, wherein a frequency thereof is divided into ¼. An output of the ¼ frequency divider 12 is divided into ½ by a ½ frequency divider 13 comprising one D-FF.

Respective outputs $\bar{Q}_5$, $Q_8$, $Q_9$ and $Q_{13}$ of the D-FFs 5, 8, 9 and 13 are supplied to a AFC gate pulse decoder 14 and in response to these outputs, the decoder 14 generates an AFC gate pulse which will be described later and supplies the same to one input of a phase comparing circuit 17. In addition, respective outputs $\bar{Q}_5$, $Q_8$, $Q_9$ and $Q_{13}$ of the D-FFs 5, 8, 9 and 13 are supplied to a first miss-lock detecting decoder 18 and in response to these outputs, the decoder 18 generates a first miss-lock detecting pulse which will be described later and supplies the same to one input of an AND gate 28 in a miss-locked detection circuit 20. Furthermore, respective outputs $Q_5$, $\bar{Q}_8$, $Q_9$ and $Q_{13}$ of the D-FFs 5, 8, 9 and 13 are supplied to a second miss-lock detecting decoder 19 and in response to these outputs, the decoder 19 generates a second miss-lock detecting pulse which will be described later and supplies the same to one input of an AND gate 29 in the miss-lock detection circuit 20.

A horizontal synchronizing signal extracted from an inputted video signal by a synchronization separating circuit (not shown) is supplied to an input terminal 15 and then supplied to a waveform shaping circuit 16. The waveform shaping circuit 16 waveform-shapes the supplied horizontal synchronizing signal to generate successive signals having a duty cycle of 50%, and then supplies the signals to other input of the phase comparing circuit 17 and to the other input of the above described AND gate 28 and also to the other input of the above described AND gate 29 and to a counter 22 which will be described later through an inverter 27.

The phase comparing circuit 17 compares phases of the AFC gate pulse outputted from the above described AFC gate pulse decoder 14 and the signal outputted from the waveform shaping circuit 16 to generate a control signal corresponding to a phase difference therebetween and supplies the control signal to the control input of the VCO 9 through a switch 26 to control an oscillating frequency of the VCO 9.

The miss-lock detection circuit 20 is comprised of the above described AND gates 28 and 29 and an OR gate 30 for detecting, as will be described late: in detail, the AFC circuit being miss-locked, in response to the output signal of the waveform shaping circuit 16, an inversion of the same inverted by the inverter 27, ant the output signals of the first and the second miss-lock detecting decoders 18 and 19.

A detection output of the miss-lock detection circuit 20 is supplied to an RS type flip-flop (referred to as RS-FF hereinafter) 21 and the RS-FF21 is set by the above described detection output, to generate an AFC mask pulse which will be described later Namely, an output $Q_{21}$ of the RS-FF21 is supplied as an AFC mask pulse to the switch 26 to control the switching. In addition, the counter 22 comprising two D-FFs10 and 11 is responsive to an output $\bar{Q}_{21}$ of the RS-FF21 for counting the output signal of the waveform shaping circuit 16.

Respective outputs $\bar{Q}_1$, $Q_6$, $Q_7$, $Q_8$, $Q_9$ and $Q_{13}$ of the D-FFs1, 6, 7, 8, 9 and 13 are supplied to a divider stopping decoder 23. The decoder 23, in response to these outputs, generates a divider stopping pulse which will be described later and supplies the same to one input of an AND gate 31 in a gate signal generating circuit 24 which will be described later. The output $Q_{21}$ of the RS-FF21, that is, the AFC mask pulse is supplied to the other input of the AND gate 31. The gate signal generating circuit 24 is responsive to these signals for generating a gate signal. More specifically, an output of the AND gate 31 is directly supplied to one input of an AND gate 35 and is also supplied to the other input of the AND gate 35 after being inverted by an inverter 33 and delayed by a predetermined time period by means of a delay circuit 34. An output of the AND gate 35 is supplied to an S input of the RS-FF12. The $\bar{Q}_{21}$ of the RS-FF21 is supplied to an R input of the RS-FF12. An output $Q_{12}$ of the RS-FF12 is applied as a gate signal to the switch 25 to control the switching thereof.

Figure 4:
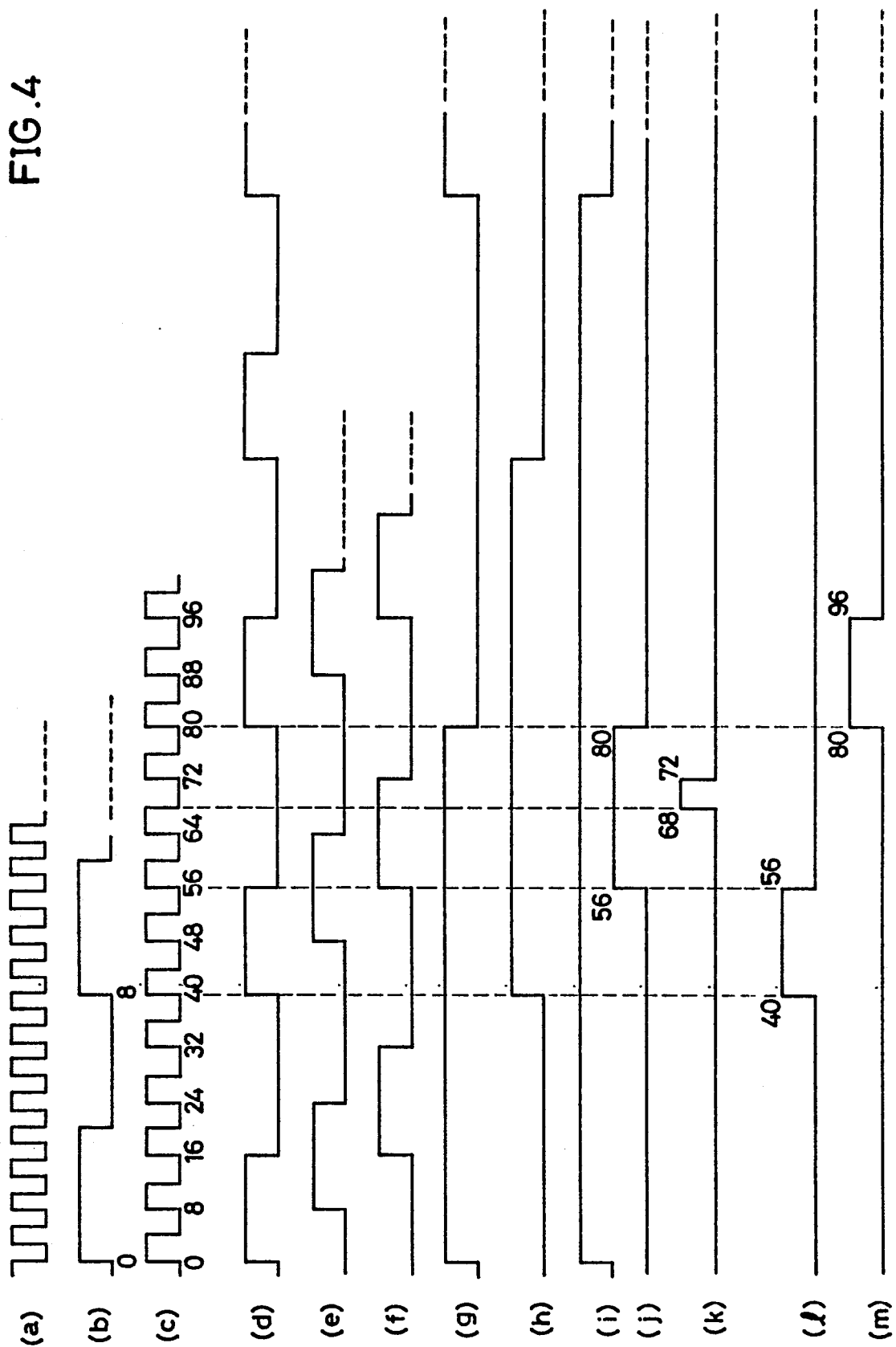

FIGS. 4, 5 and 6 are timing charts for explaining the operation of the AFC circuit shown in FIG. 3. The operation of the AFC circuit according to one embodiment of the present invention will be described with reference to FIGS. 3 to 6 hereinafter.

First, the outputted signal of the VCO 9 having the oscillating frequency of 320$f_H$ (FIG. 4 (a) is frequency divided into ¼ in the ¼ divider 10. On this occasion, a $Q_1$ output, as shown in FIG. 4(b), of the D-FF1 constituting the ¼ frequency divider is obtained and FIG. 4(c) shows reduction of the signal $Q_1$. A $\bar{Q}_1$ output of the D-FF1 (of an opposite phase to that of $Q_1$ of FIG. 4(b)) is applied to the 1/5 frequency divider 11.

When the $\overline{Q}_1$ output is applied to the respective D-FFs5, 6 and 7 of the 1/5 frequency divider 11, Q outputs $Q_5$, $Q_6$ and $Q_7$ of these D-FFs as shown in FIGS. 4 (d), (e) and (f), respectively, are obtained. On this occasion, the $\overline{Q}_5$ output of the D-FF5 constituting the 1/5 frequency divider 11 is applied to the ¼ frequency divider 12. When the $\overline{Q}_5$ output is applied to the D-FFS8 and 9 of the ¼ frequency divider 12, the outputs $Q_8$ and $Q_9$ of these D-FFs as shown in FIGS. 4 (g) and (h) are obtained. On this occasion, the $\overline{Q}_8$ output of the D-FF8 constituting the ¼ frequency divider 12 is applied to the D-FF13 and the output $Q_{13}$ as shown in FIG. 4 (i) is obtained.

The outputs $\overline{Q}_5$, $Q_8$, $Q_9$ and $Q_{13}$ of the D-FFs5, 8 and 9 and 13 are applied to the AFC gate pulse decoder 14 and the decoder 14 generates the AFC gate pulse shown in FIG. 4 (j), to supply the same to the one input of the phase comparing circuit 17. The AFC gate pulse, as shown in FIG. 4 (j), defines a period from the 56th pulse to the 80th pulse among the oscillating output pulses of the VCO 9 constituting one horizontal period.

The respective outputs $\overline{Q}_1$, $\overline{Q}_6$, $Q_7$, $Q_8$, $Q_9$ and $Q_{13}$ of the D-FFs1, 6, 7, 8, 9 and 13 are applied to the divider stopping decoder 23 and the decoder 23 generate the divider stopping pulse shown in FIG. 4 (k) to supply the same to the gate signal generating circuit 24. The divider stopping pulse, as shown in FIG. 4 (k), defines a period from the 68th pulse to the 72th pulse among the output pulses of the VCO 9. In addition, the outputs $Q_5$, $Q_8$, $Q_9$ and $Q_{13}$ of the D-FFs5, 8, 9 and 13 are applied to the first miss-lock detecting decoder 18. The decoder 18 generates a first miss-lock detection pulse as shown in FIG. 4 (l) to supply the same to the miss-lock detection circuit 20. The first miss-lock detection pulse, as shown in FIG. 4 (l), defines a period from the 40th pulse to the 56th pulse among the output pulses of the VCO 9. Furthermore, the respective outputs $Q_5$, $\overline{Q}_8$, $Q_9$ and $Q_{13}$ of the D-FFs5, 8, 9 and 13 are applied to the second miss-lock detecting decoder 19. The decoder 19 generates a second miss-lock detection pulse as shown FIG. 4 (m) to supply the same to the miss-lock detection circuit 20. The second miss-lock detection pulse, as shown in FIG. 4 (m), defines a period from the 80th pulse to the 96th pulse among the output pulses of the VCO 9.

Now referring to the timing chart of FIG. 5, description will be made of an operation when the oscillating signal of the VCO 9 is stably locked with respect to the inputted horizontal synchronizing signal in the AFC circuit of FIG. 3.

The horizontal synchronizing signal inputted from the input terminal 15 is waveform-shaped by the waveform shaping circuit 16 so as to have a duty cycle of 50%, as shown in FIG. 5 (a) and thereafter applied to the other input of the phase comparing circuit 17. As described above, the AFC gate pulse shown in FIG. 4 (j) is applied to the one input terminal of the phase comparing circuit 17 (FIG. 5 (b)) and the phase comparing circuit 17 compares the phases of both signals. As a result, an output corresponding to the phase difference between both signals is supplied to the VCO 9 through the switch 26 to control the oscillating frequency of the VCO 9 such that both the signals have a predetermined phase relation, namely, a timing of the 68th VCO oscillating pulse is locked to the rise of the horizontal synchronizing signal (FIG. 5 (a)) during the AFC gate pulse period.

The horizontal synchronizing signal obtained from the waveform shaping circuit 16 (FIG. 5 (a)) is applied to the miss-lock detection circuit 20 directly and also after being inverted by the inverter 27. FIGS. 5 (c) and (d) correspond to the first and the second miss-lock detecting pulses shown in FIGS. 4 (l) and (m), respectively.

The first miss-lock detecting pulse of FIG. 5 (c), together with the horizontal synchronizing signal of FIG. 5 (a), is supplied to the AND gate 28 in the miss-lock detection circuit 20 and the phases thereof are compared The second miss-lock detecting pulse of FIG. 5 (d), together with the inversion of the signal of FIG. 5 (a) (not shown), is supplied to the AND gate 29 in the miss-lock detection circuit 20 and the phases thereof are compared. More specifically, in the phase relation shown in FIG. 5, both outputs of the AND gates 28 and 29 are always at the "L" (logical low) level and accordingly the output of the OR gate 30 is at the "L" level. Therefore, so long as the phase relation of FIG. 5 is established, the RS-FF21 maintains the reset state, so that the output $\overline{Q}_{21}$ thereof causes the D-FFs10 and 11 constituting the counter 22 and the RS-FF12 in the gate signal generating circuit 24 to maintain the reset state.

Furthermore, the output $Q_{21}$ of the R3-FF21 causes the AND gate 31 in the gate signal generating circuit 24 to be closed while closing the switch 26. In addition, the output $Q_{12}$ of the D-FF12 causes the switch 25 to be closed. As a result, the output signal of the phase comparing circuit 17 is applied to the VCO 9 through the switch 26, whereby the oscillating output signal of the VCO 9 is applied to the ¼ frequency divider circuit 10 through the switch 25.

Accordingly, the AFC circuit of FIG. 3 keeps a stable operation to supply the oscillating output signal of the VCO 9 synchronized with the horizontal synchronizing signal through the output terminal 32.

Now, operation will be made of a case wherein the phase of the inputted horizontal synchronizing signal is changed from the state shown in FIG. 5, with reference to FIG. 6.

More specifically, it is assumed that a period of the horizontal synchronizing signal inputted from the input terminal 15 changes and a signal obtained from the waveform shaping circuit 16 fluctuates in a period $T_O$ as shown in FIG. 6 (a). In addition, FIG. 6 (b) corresponds to the AFC gate pulse (FIG. 4(j)) from the AFC gate pulse decoder 14 and the phase comparing circuit 17 compares the phases of both signals shown in FIGS. 6 (a) and (b).

The signal of FIG. 6 (a) and the inversion signal thereof (not shown) are applied to the miss-lock detection circuit 20 and then compared with the first and second miss-lock detecting pulses obtained from the first and the second miss-lock detecting decoders 18 and 19, respectively. Then, since a phase of the second AFC pulse of FIG. 6 (b) advances as compared with the horizontal synchronizing signal of FIG. 6 (a), the miss-lock detection circuit 20 detects the AFC circuit being miss-locked, thereby generating the miss-lock pulse shown in FIG. 6 (c) and applying the same to the RS-FF21.

When the RS-FF21 is set in response to the miss-lock pulse, the output $Q_{21}$ attains the "H" (logical high) level as shown in FIG. 6 (g) and the output $\overline{Q}_{21}$ attains the "L" level as shown in FIG. 6 (d). When the output $\overline{Q}_{21}$ attains the "L" level, the reset of D-FFs10 and 11 constituting the counter 22 is released, and as a result, the counter 22 counts the rises of the signal of FIG. 6 (a). Then, when the counter 22 counts a rise of the signal of FIG. 6 (a) twice, an output $Q_{11}$ of the D-FF 11 attains the "H" level and the RS-FF21 is reset. Then, the output $\bar{Q}_{21}$ of the RS-FF21 attains the "H" level again and the counter 22 is reset. Accordingly, the output e,ovs/Q/$_{21}$ of the RS-FF21 as shown in FIG. 6 (d) and an output $Q_{10}$ of the D-FF10 as shown in FIG. 6 (e) is obtained and the output $Q_{11}$ of the D-FF11 fluctuates as shown in FIG. 6 (f).

At the same time, the output $Q_{21}$ of the RS-FF21 as shown in FIG. 6 (g) is obtained and is applied as the AFC mask pulse to the switch 26. The switch 26 is switched off in response to the AFC mask pulse, so that the output of the phase comparing circuit 17 is not applied to the VCO 9. As a result, the defective control signal output is cut off, which is generated from the phase comparing circuit 17 as a result of a phase comparison between the second pulse of the AFC gate pulse of FIG. 6 (b) and the horizontal synchronizing signal of FIG. 6 (a) which period is fluctuated, so that it is not supplied to the VCO 9.

In addition, the output $Q_{21}$ of the RS-FF21 is also supplied to the AND gate 31 in the gate signal generating circuit 24. The divider stopping pulse of FIG. 6 (h) (corresponding to FIG. 4 (k)) is also supplied to the AND gate 31 from the divider stopping decoder 23, and consequently the output of the AND gate 31 as shown in FIG. 6 (i) is obtained. The signal of FIG. 6 (i) is inverted in the inverter 33 and delayed in the delay circuit 34 by a predetermined time period to become as shown in FIG. 6 (j). Then, the signals shown in FIGS. 6 (i) and (j) are applied to the AND gate 35 and the output thereof becomes as shown in FIG. 6 (k), so that output pulse thereof sets the RS-FF12. Thus, set RS-FF12 is reset by the output $\bar{Q}_{21}$ of the RS-FF21 (FIG. 6 (d)). As a result, the output $Q_{12}$ of the RS-FF12 as shown in FIG. 6 (l) is obtained.

Therefore, the gate signal of FIG. 6 (l) is supplied from the gate signal generating circuit 24 to the switch 25 to turn it off. When the switch 25 is turned off, no output signal of the VCO 9 is supplied to the ⅛ frequency divider 10, so that each of the ⅛ frequency divider 10, the 1/5 frequency divider 11, the ¼ frequency divider 12 and the ¼ frequency divider 13 stops its dividing operation with 68 (a predetermined counting value when the AFC circuit is locked) oscillating output pulses (clocks) of the VCO counted during a horizontal period. Thereafter, when the gate signal of FIG. 6 (l) returns to the "L" level, the switch 25 is again turned on, whereby the operations of the frequency dividers are restarted from the state wherein 68 clocks have been counted. Then, when the frequency dividers count additional 12 clock pulses, starting from 68 up to 80, the AFC gate pulse, of FIG. 6 (b) returns to the "L" level. As the foregoing, the state wherein 80 clocks are counted is restoration of the state wherein the AFC gate pulse of FIG. 6 (b) is correctly locked with respect to the horizontal synchronizing signal of FIG. 6 (a). Accordingly, it is possible to restore the phase relation of both the signals of FIGS. 6 (a) and (b) in the subsequent horizontal period to be totally equal to the normal relation that is before the fluctuation. As the foregoing, according to the above described embodiment, even if the period of the horizontal synchronizing signal is fluctuated and the locked AFC circuit is released, it is possible to capture again the AFC circuit to the original locked state in the second period.

While in the foregoing description of the embodiment a counting value of the counter 22 is set to "2", so that the capturing operation is performed in the earliest second period, the counting value of the counter 22 is not limited to "2" but may be set arbitrarily.

In addition, while in the above described embodiment, since it is prescribed such that the rise of the horizontal synchronizing signal synchronizes with a timing at which the clock counting value of the frequency divider reaches 68, the frequency divider is to be stopped at the counting value 68 during the generation of fluctuation of the horizontal synchronizing signal, if the counting value of the divider in the locked state is prescribed to be another value, the counting value at which the frequency divider is to be stopped may be changed corresponding thereto. It is not always necessary to set the counting value at which the frequency divider is to be stopped at the same value as that in the locked state, as in case of the above described embodiment, and may be set to be approximate to that value. For example, in the embodiment of FIG. 3, any value between 69 to 71 allows the same operation. However, the larger the value becomes than 68 the more time is required to capture into a completely locked state (counting value 68).

As the foregoing, according to the embodiment of the present invention, it is possible to reduce a capturing time period of the AFC circuit without increasing the loop gain of the AFC circuit. As a result, deterioration of the hue in an upper region of a picture frame can be prevented even in case of dubbing by using a different VTR and recording on a tape of a received video signal in the weak electric field.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic frequency control circuit comprising:
    voltage controlled oscillator means for providing an oscillating output signal having a frequency which changes in response to a control input;
    frequency dividing means for frequency dividing the oscillating output signal of said voltage controlled oscillator means by a predetermined division ratio;
    phase comparing means for comparing phases of an externally supplied input reference signal and an output signal of said frequency dividing means to generate an error output and supply the error output to said voltage controlled oscillator means as said control input such that said input reference signal and the output signal of said frequency dividing means enter a phase-locked state wherein both the input reference signal and the output signal of said frequency dividing means have a predetermined phase relation;
    miss-lock detecting means for detecting the phase relation between said input reference signal and the output signal of said frequency dividing means entering a miss-lock state out of said predetermined phase relation;
    frequency division interrupting means responsive to a detection signal in the miss-locked state from said miss-lock detecting means for once interrupting a frequency dividing operation of said frequency dividing means at a predetermined timing, and thereafter, restarting the frequency dividing operation in response to a subsequent input reference signal, thereby forcibly restoring the phase locked state of said input reference signal and the output signal of said frequency dividing means, said frequency division interrupting means comprising:
  counter means responsive to the output of said miss-lock detecting means for counting pulses of said subsequent input reference signal by a predetermined number;
  means for defining a first period starting from said predetermined timing after the detection of said miss-lock state until the end of the counting by said counter means; and
  a first switch for cutting off the supply of the oscillating output signal of said voltage controlled oscillator means for said frequency dividing means during said first period; and
  an output terminal for taking out an output of said voltage controlled oscillator means.

2. An automatic frequency control circuit comprising:
  voltage controlled oscillator means for providing an oscillating output signal having a frequency which changes in response to a control input;
  frequency dividing means for frequency dividing the oscillating output signal of said voltage controlled oscillator means by a predetermined division ratio;
  phase comparing means for comparing phases of an externally supplied input reference signal and an output signal of said frequency dividing means to generate an error output and supply the error output to said voltage controlled oscillator means as said control input such that said input reference signal and the output signal of said frequency dividing means enter a phase-locked state wherein both the input reference signal and the output signal of said frequency dividing means have a predetermined phase relation;
  miss-lock detecting means for detecting the phase relation between said input reference signal and the output signal of said frequency dividing means entering a miss-lock state out of said predetermined phase relation;
  frequency division interrupting means responsive to a detection signal in the miss-locked state from said miss-lock detecting means for once interrupting a frequency dividing operation of said frequency dividing means at a predetermined timing, and thereafter, restarting the frequency dividing operation in response to a subsequent input reference signal, thereby forcibly restoring the phase locked state of said input reference signal and the output signal of said frequency dividing means;
  mask means responsive to the detection signal in the miss-locked state from said miss-lock detecting means for immediately interrupting a supply of the error output of said phase comparing means to said voltage controlled oscillator means and restarting the supply in response to said subsequent input reference signal, said mask means comprising:
    counter means responsive to the output of said miss-lock detecting means for counting pulses of said subsequent input reference signal by a predetermined number;
    means for defining a second period starting from the timing of detection of the miss-lock state by said miss-lock detecting means until the end of the counting by said counter means; and
    a second switch for cutting off the supply of the error output of said phase comparing means to said voltage controlled oscillator means during said second period; and
  an output terminal for taking out an output of said voltage controlled oscillator means.

* * * * *